(12) United States Patent
Derraa et al.

(10) Patent No.: US 6,822,299 B2
(45) Date of Patent: Nov. 23, 2004

(54) BORON-DOPED TITANIUM NITRIDE LAYER FOR HIGH ASPECT RATIO SEMICONDUCTOR DEVICES

(75) Inventors: Ammar Derraa, Boise, ID (US); Sujit Sharan, Chandler, AZ (US); Paul Castrovillo, Boise, ID (US)

(73) Assignee: Micron Technology Inc., Boise, ID (US)

( * ) Notice: Subject to any disclaimer, the term of this patent is extended or adjusted under 35 U.S.C. 154(b) by 168 days.

(21) Appl. No.: 10/287,203

(22) Filed: Nov. 4, 2002

(65) Prior Publication Data

US 2003/0075802 A1 Apr. 24, 2003

Related U.S. Application Data

(62) Division of application No. 09/918,919, filed on Jul. 31, 2001.

(51) Int. Cl.[7] .................. H01L 29/76; H01L 29/94; H01L 31/62; H01L 31/113; H01L 31/119
(52) U.S. Cl. .................................................. 257/383
(58) Field of Search ................. 257/383, 81, 44, 257/99, 276, 343, 576, 621, 700, 734, 745, 767

(56) References Cited

U.S. PATENT DOCUMENTS

| | | | |
|---|---|---|---|
| 5,700,716 A | 12/1997 | Sharan et al. | 437/190 |
| 5,747,116 A | 5/1998 | Sharan et al. | 427/534 |
| 5,851,680 A | * 12/1998 | Hieu | 438/47.2 |
| 5,908,947 A | 6/1999 | Vaartstra | 556/42 |
| 5,946,594 A | 8/1999 | Iyer et al. | 438/648 |
| 5,976,976 A | 11/1999 | Doan et al. | 438/683 |
| 5,977,636 A | 11/1999 | Sharan | 257/763 |
| 5,990,021 A | 11/1999 | Prall et al. | 438/745 |
| 6,037,252 A | 3/2000 | Hillman et al. | 438/637 |
| 6,054,191 A | 4/2000 | Sharan et al. | 427/534 |
| 6,086,442 A | 7/2000 | Sandhu et al. | 445/24 |
| 6,156,638 A | 12/2000 | Agarwal et al. | 438/627 |
| 6,184,135 B1 | 2/2001 | Ku | 438/683 |
| 6,200,649 B1 | 3/2001 | Dearnaley | |
| 6,329,670 B1 | 12/2001 | Hu | |
| 6,511,900 B2 | 1/2003 | Agarwal et al. | |
| 2001/0002071 A1 | 5/2001 | Agarwal | 257/751 |
| 2001/0030235 A1 | 10/2001 | Hedemann et al. | |
| 2001/0030552 A1 | 10/2001 | Hu | 324/763 |
| 2002/0001908 A1 | 1/2002 | Agarwal et al. | |
| 2003/0042606 A1 | 3/2003 | Derraa | |
| 2003/0042607 A1 | 3/2003 | Derraa et al. | |
| 2003/0077895 A1 | 4/2003 | Derraa et al. | |

FOREIGN PATENT DOCUMENTS

| | | | | |
|---|---|---|---|---|
| JP | 05267220 | 10/1993 | | H01L/21/285 |
| JP | 09306870 | 11/1997 | | H01L/21/285 |

* cited by examiner

*Primary Examiner*—Craig Thompson
(74) *Attorney, Agent, or Firm*—Whyte Hirschboeck Dudek SC

(57) ABSTRACT

Conductive contacts in a semiconductor structure, and methods for forming the conductive components are provided. The contacts are useful for providing electrical connection to active components beneath an insulation layer in integrated circuits such as memory devices. The conductive contacts comprise boron-doped $TiCl_4$-based titanium nitride, and possess a sufficient level adhesion to the insulative layer to eliminate peeling from the sidewalls of the contact opening and cracking of the insulative layer when formed to a thickness of greater than about 200 angstroms.

95 Claims, 6 Drawing Sheets

BORON-DOPED TITANIUM NITRIDE LAYER FOR HIGH ASPECT RATIO SEMICONDUCTOR DEVICES

This application is a division of application Ser. No. 09/918,919, filed Jul. 31, 2001.

FIELD OF THE INVENTION

The present invention relates to the field of semiconductor device fabrication, and more particularly to methods for making conductive contacts in the formation of a semiconductor device.

BACKGROUND OF THE INVENTION

As semiconductor fabrication moves toward maximizing circuit density, electrical components are formed at a number of layers and different locations. This requires electrical connection between metal layers or other conductive layers at different elevations in the substrate. Such interconnections are typically provided by forming a contact opening through insulating layer to the underlying conductive feature. With increasing circuit density, the dimensions of openings for electrical contacts become narrower and deeper, posing a challenge to provide adequate conductive fill within high aspect ratio openings.

Typically, in forming a contact plug, a thin layer of titanium is deposited over the top of a silicon base layer (substrate), and tungsten or other electrically conductive plug material is then deposited from tungsten hexafluoride ($WF_6$) by chemical vapor deposition (CVD) to fill the contact hole. However, there are several limitations of tungsten (W) plugs. Tungsten does not provide an adequate fill for high aspect ratio features. In addition, the use of $WF_6$ as a precursor gas in the formation of tungsten plugs, can result in the penetration of the fluoride component into the adjacent dielectric layer causing lateral encroachment and wormholes.

Titanium nitride (TiN) films have attractive properties that may overcome the limitations of tungsten plugs as integrated circuit (IC) devices continue to shrink below 0.15 micron dimension. TiN films have been deposited by low pressure chemical vapor deposition (LPCVD) using tetrakisdimethylamidotitanium (TDMAT) and ammonia as precursor gases. However, TDMAT films have a high carbon content and when subjected to high temperatures in the presence of oxygen, become porous and, therefore, are unusable as a conductive contact.

TiN films and liners have also been deposited from titanium tetrachloride ($TiCl_4$) and ammonia ($NH_3$) by CVD onto a titanium (Ti) liner overlying the insulative layer. Although useful for forming a thin liner, when pure $TiCl_4$-based TiN is deposited to fill a via or other contact opening, the material does not adhere well to the Ti thin layer, particularly when the TiN layer becomes greater than about 150 to about 200 angstroms thick.

Therefore, it would be desirable to provide a titanium nitride material that can be used as a replacement fill material for tungsten in forming conductive contacts in high aspect ratio features in a semiconductor device.

SUMMARY OF THE INVENTION

The present invention provides methods for forming conductive contacts in the construction of semiconductive devices, and the conductive components formed by those methods. The method is useful for fabricating contacts to electrical components beneath an insulation layer in an integrated circuit such as memory devices.

The present $TiCl_4$-based titanium nitride films are particularly useful as conductive contacts to replace tungsten (W) plugs in high aspect ratio features, particularly openings and other features having an aspect ratio of 3:1 or greater. The films also overcome inadequacies of pure $TiCl_4$-based titanium nitride films that are used as fill material for forming conductive contacts or interconnects within contact openings formed through an insulative layer of a semiconductor structure. Pure $TiCl_4$-based titanium nitride fills do not adhere well to the surface of insulative sidewalls of a contact opening, and can also cause the insulative layer to crack due, at least in part, to the pressure exerted when the thickness of the fill within the contact opening is about 200 angstroms or greater.

The present invention overcomes the problems of a pure $TiCl_4$-based titanium nitride plugs or barrier film by incorporating diborane ($B_2H_6$) into the gas mixture to dope the $TiCl_4$-based titanium nitride film during the deposition process. The addition of $B_2H_6$ to the precursor gas used to form the $TiCl_4$-based titanium nitride film has been found to improve the mechanical properties of the resulting titanium nitride film with substantially no impact on its conductive properties. In particular, the gaseous mixture used to form the boron-doped, titanium nitride contacts comprises diborane ($B_2H_6$) in an amount effective to provide a contact having an amount of boron to provide a level of adhesion of the conductive contact to the insulative sidewalls of the contact opening to substantially eliminate peeling of the contact from the sidewalls and cracking of the body of the insulative layer. The mixture further includes an amount of ammonia ($NH_3$) to provide the contact with a level of nitrogen effective to maintain the conductivity of the contact at a predetermined level for an effective electrical contact with a conductive or active area within the substrate to/from an active area within a semiconductor device and/or a memory or logic array.

In one aspect, the invention provides methods for forming a titanium nitride conductive contact in a via or other contact opening of a semiconductor structure. The opening is formed through an insulative layer to a conductive area, such as a source/drain region, in an underlying silicon substrate. The method is particularly useful for forming conductive contacts within vias and other openings having an aspect ratio of about 3:1 or greater, and a width dimension of about 0.25 $\mu$m or less.

According to one embodiment of the method of the invention, a titanium nitride conductive contact is formed by first depositing a seed layer comprising titanium silicide ($TiSi_x$) over the silicon substrate at the bottom of the contact opening, preferably to a thickness of about 250 to about 300 angstroms. Preferably, the $TiSi_x$ seed layer is deposited from titanium tetrachloride ($TiCl_4$) and hydrogen ($H_2$) by plasma-enhanced chemical vapor deposition (PECVD).

A boron-doped titanium nitride film (i.e., titanium boronitride, $TiB_xN_y$) is then deposited onto the seed layer to fill the contact opening, typically to a thickness of about 1000 to about 3000 angstroms. Preferably, the $TiB_xN_y$ layer is deposited from a gas mixture of $TiCl_4$, $NH_3$, $B_2H_6$, and one or more carrier gases, by thermal CVD at a pressure of about 1 to about 15 Torr and a temperature of about 550 to about 700° C. The substrate can then be processed to remove excess material, for example, by chemical-mechanical polishing, to form the conductive contact in the opening.

In another embodiment of the method of the invention, a multi-layered titanium nitride conductive contact is formed within a contact opening of a semiconductive structure. A titanium silicide seed layer is first formed over the silicon substrate at the bottom of the contact opening. To form the layered contact, alternating layers of titanium nitride and boron-doped titanium nitride are then deposited over the seed layer. In forming the alternating layers, a layer comprising titanium nitride (undoped) can be deposited from a first gaseous mixture comprising $TiCl_4$ and $NH_3$, to form a layer typically about 100 to about 500 angstroms thick. Diborane ($B_2H_6$) can then be introduced into the gaseous mixture to deposit an intermediate layer of boron-doped titanium nitride to form a layer typically about 100 to about 500 angstroms thick. The flow of diborane into the gas mixture can then be stopped to deposit a next layer of titanium nitride layer that is not doped to a typical thickness of about 100 to about 500 angstroms. Additional alternating layers of doped and undoped titanium nitride can be deposited to fill the opening, with the uppermost layer being undoped titanium nitride.

Another aspect of the invention is a conductive contact formed in a semiconductor structure of a semiconductor circuit. The semiconductor structure comprises a silicon substrate, an overlying insulative layer, a contact opening formed through the insulative layer to expose the underlying silicon substrate, and the conductive contact formed within the opening.

In one embodiment of the conductive contact according to the invention, the contact comprises a layer of boron-doped titanium nitride overlying a thin titanium silicide layer formed on the substrate at the bottom of the opening.

In another embodiment, the conductive contact comprises multiple layers of titanium nitride overlying a thin titanium silicide layer deposited onto the silicon substrate at the bottom of the contact opening. The contact comprises alternating, overlying layers of undoped and boron-doped titanium nitride that fill the contact opening. An undoped titanium nitride layer overlies the titanium silicide layer, and also forms the uppermost layer of the conductive contact. The thickness of each of the individual layers is typically about 100 to about 500 angstroms.

Another aspect of the invention is an integrated circuit (IC) device that includes the foregoing conductive contacts comprising boron-doped titanium nitride. The IC device comprises an array of memory or logic cells, internal circuitry, and at least one generally vertical conductive contact coupled to the cell array and internal circuitry.

In one embodiment of an integrated circuit device according to the invention, the IC device comprises a conductive contact of boron-doped titanium nitride that is formed within an insulative contact opening over a thin layer of titanium silicide deposited onto the exposed substrate at the bottom of a contact opening. In another embodiment of an integrated circuit device, the conductive contact is multi-layered and comprises alternating layers of titanium nitride (undoped) and boron-doped titanium nitride deposited onto a titanium silicide layer overlying the substrate at the bottom of a contact opening. The contact is in electrical contact with a conductive area or active area such as a source/drain region of a transistor or a memory or logic cell array, or other semiconductor device.

Advantageously, the present film overcomes limitations of tungsten plug fills in high aspect ratio devices, with parametric data showing superior results compared to that of tungsten. The present invention provides processes for forming conductive contacts that are fast, simple and inexpensive to implement in semiconductor manufacturing.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate the same or like parts.

DETAILED DESCRIPTION OF THE PREFERRED EMBODIMENTS

The present invention encompasses methods of making integrated circuits, particularly methods for forming conductive contacts for providing electrical connection between conductive or active areas of discrete semiconductor devices or portions of such devices. In particular, the invention relates to a contact structure incorporating a boron-doped titanium nitride film. The present invention is particularly useful in providing a conductive contact in openings and other features having a high aspect ratio of 3:1 or greater.

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

Integrated circuits include a large number of electronic semiconductor devices that are formed on varying levels of a semiconductor substrate. Exemplary semiconductor devices include capacitors, resistors, transistors, diodes, and the like. In manufacturing an integrated circuit, the discrete semiconductor devices that are located on nonadjacent structural levels are electrically connected, for example with an interconnect or conductive contact structure. The conductive contact generally comprises a region of conducting material that is formed between the semiconductor devices or portions of the semiconductor devices that are being placed in electrical communication. The conductive contact serves as a conduit for delivering electrical current between the semiconductor devices. Specific types of conductive contact structures include local interconnects, contacts, buried contacts, vias, plugs, and filled trenches. The present invention particularly deals with the method of making conductive contacts that are used in the fabrication of semiconductor devices.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

A first embodiment of a method of the present invention is described with reference to FIGS. 1A through 1D, in a method of forming a conductive contact 34. The contact is illustrated and will be described as being coupled to a diffusion region; however, the contacts of the present invention can be used wherever required within the structure of a semiconductor circuit.

Figure 1A:
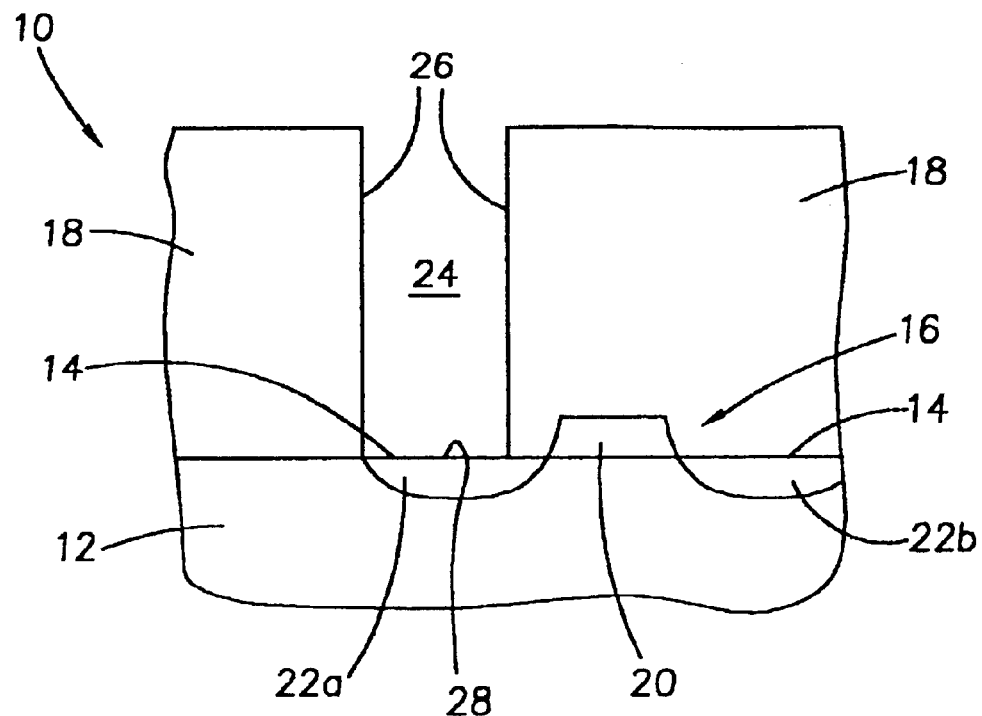
FIG. 1A is a diagrammatic cross-sectional view of a semiconductor wafer fragment at a preliminary step of a processing sequence.

Referring to FIG. 1A, a semiconductive wafer fragment 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as including a silicon-comprising base layer or substrate 12. An exemplary substrate 12 is monocrystalline silicon that is typically lightly doped with a conductivity enhancing material. Formed at the surface 14 of the substrate 12 are a transistor structure 16 and an overlying insulative layer 18. The transistor 16, comprising a gate 20 and adjacent source/drain diffusion regions 22a, 22b, can be formed by conventional methods known and used in the art.

The insulative layer 18 comprises an oxide, for example, silicon dioxide ($SiO_2$), phosphosilicate glass (PSG), borosilicate glass (BSG), and borophosphosilicate glass (BPSG), in a single layer or multiple layers, being BPSG in the illustrated embodiment. The BPSG insulative layer 18 has been etched using a known photolithography technique, for example, reactive ion etching (RIE), while masking with a patterned photoresist layer (not shown) to provide a via or other contact opening 24 defined by insulative sidewalls 26 and a bottom portion 28. The contact opening extends to the diffusion region 22a (i.e., source/drain region) in the underlying silicon substrate 12 to which electrical contact is to be made.

Figure 1B:
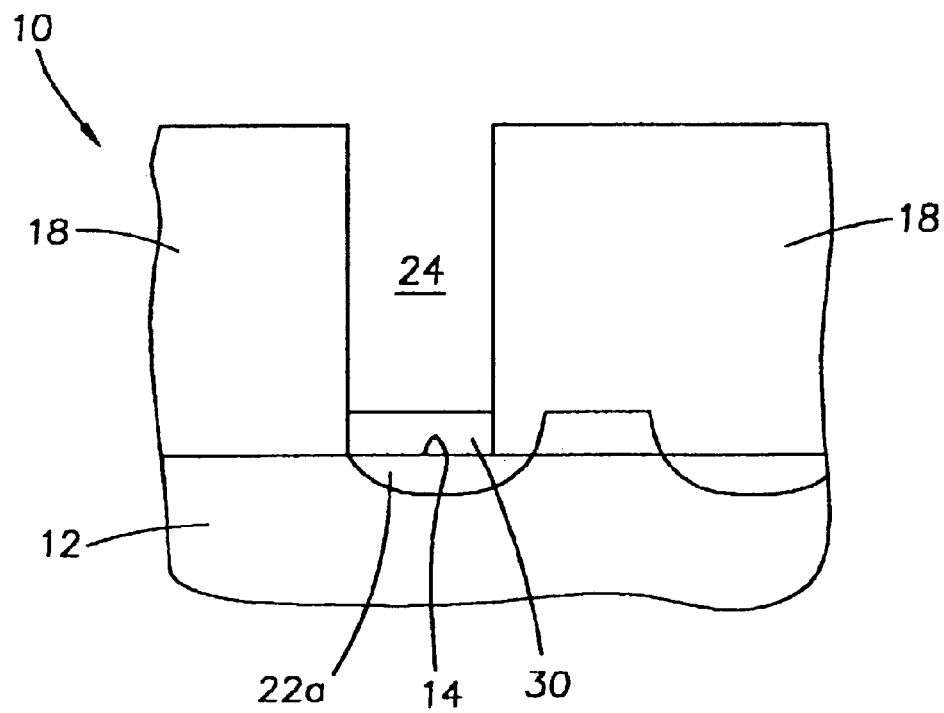
FIGS. 1B through 1D are views of the wafer fragment of FIG. 1A at subsequent and sequential processing steps, showing fabrication of a conductive contact according to an embodiment of the method of the invention.
Figure 1C:
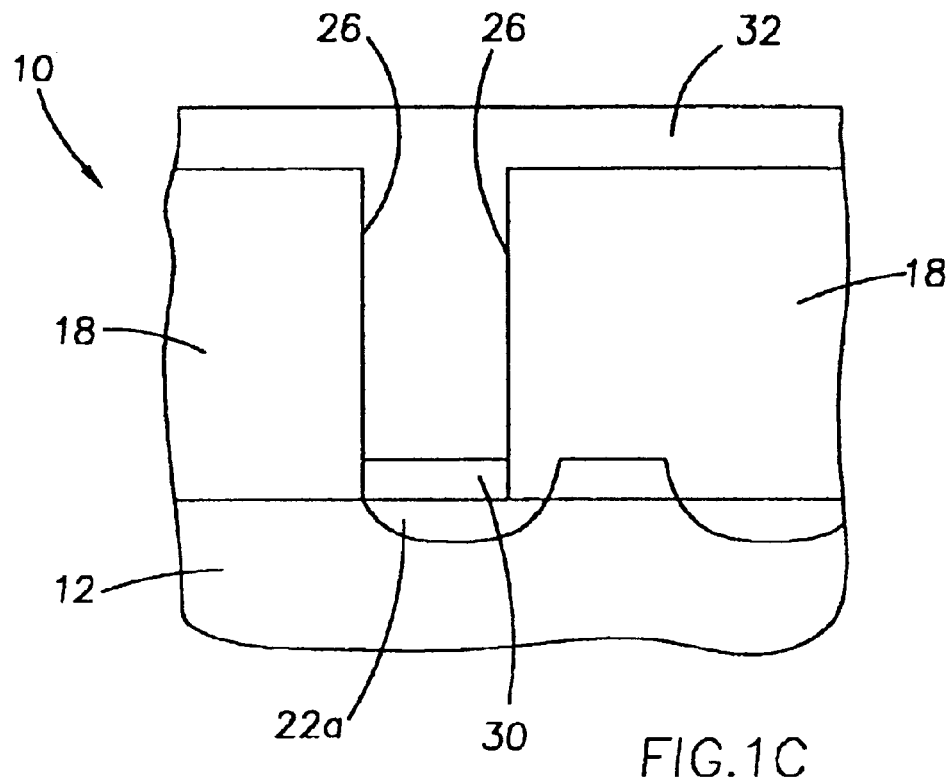

Referring to FIG. 1B, a titanium silicide ($TiSi_x$) seed layer 30 is formed over the exposed surface 14 of the silicon substrate at the bottom 28 of the contact opening 24. Typically, the seed layer is formed to a thickness of about 250 to about 300 angstroms. The resulting $TiSi_x$ seed layer 30 that forms at the interface with the diffusion region 22a is useful to lower resistance in the contact region. Techniques and process systems for forming a titanium silicide layer are well known in the art, as described, for example, in U.S. Pat. No. 6,086,442 (Sandhu, et al.) and U.S. Pat. No. 5,976,976 (Doah, et al.), the disclosures of which are incorporated by reference herein.

Preferably, the $TiSi_x$ seed layer 30 is formed by a conventional plasma-enhanced chemical vapor deposition (PECVD) process that comprises forming an RF plasma from source gases comprising titanium tetrachloride ($TiCl_4$), hydrogen ($H_2$), and carrier gases such as argon (Ar) and/or helium (He) to deposit a layer of titanium (Ti) over the substrate (silicon) surface. When the titanium film is deposited, the titanium reacts with the silicon to form a $TiSi_x$ film layer 30. Exemplary process conditions for achieving the formation of the $TiSi_x$ seed layer 30 include a wafer temperature of about 600° C., a process pressure of about 0.5 to about 20 Torr, a power range of about 100 to about 800 watts (using a parallel plate single wafer plasma reactor), and flow rates of about 150 to about 300 sccm $TiCl_4$, about 1000 to about 8000 sccm hydrogen ($H_2$), about 1000 sccm argon (Ar), and about 50 sccm nitrogen ($N_2$).

Although the preferred process for forming the $TiSi_x$ seed layer is by PECVD technique, the $TiSi_x$ seed layer 30 can also be formed by a depositing a thin layer of titanium by physical vapor deposition (PVD), i.e., sputtering, onto the surface 14 of the substrate 12 at the bottom of the contact opening, and then performing an anneal step (about 650° C.) in an ambient gas such as nitrogen, argon, ammonia, or hydrogen. This causes the titanium to react with the silicon exposed on the surface 14 of the diffusion region 22a to form the $TiSi_x$ seed layer 30. Such a process is said to be self-aligning, as the $TiSi_x$ is only formed where the titanium metal contacts the silicon active regions.

Another example of a method to deposit the $TiSi_x$ seed layer 30 is by a conventional low pressure CVD (LPCVD) process. Exemplary process conditions include a process temperature of about 650° C. to about 900° C., and a pressure of about 10 mTorr to about 1 Torr, using titanium tetrachloride ($TiCl_4$) plus a silicon precursor or source gas such as silane ($SiH_4$) or dichlorosilane ($SiH_2Cl_2$) at a ratio of about 5:1, in a carrier gas such as helium.

Figure 1D:
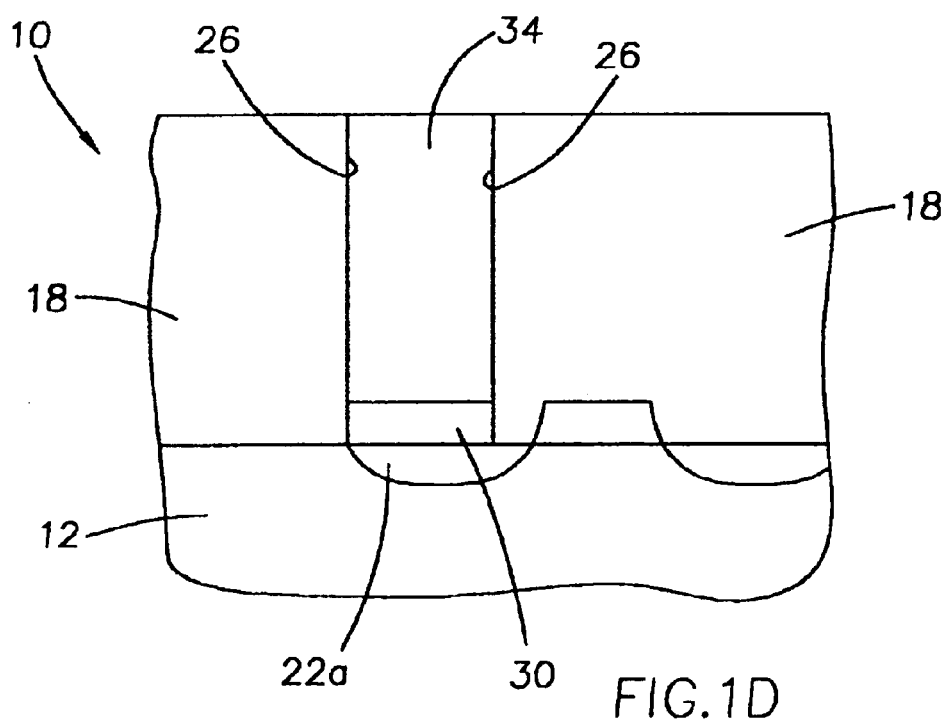

To overcome the problems that occur in the use of a pure $TiCl_4$-based titanium nitride plug or contact, such as peeling of the contact from the insulative sidewalls of the contact opening and cracking of the insulative layer, the invention utilizes a boron-doped, $TiCl_4$-based titanium nitride fill (titanium boronitride) to form the conductive contact or plug 34, as shown in FIG. 1D. Preferably, the foregoing conductive contact is formed by a conventional thermal chemical vapor deposition (TCVD) process. Such TCVD techniques and process systems are well known in the art, as described, for example, in U.S. Pat. No. 6,037,252 (Hillman et al.), and U.S. Pat. No. 5,908,947 (Iyer and Sharan), the disclosures of which are incorporated by reference herein. TCVD systems include standard thermal reactors such as cold wall/hot substrate reactors and hot wall reactors, plasma-assisted reactors, radiation beam assisted reactors, and the like.

Typically, in a TCVD process, the substrate is placed in a reaction chamber (not shown) in which the substrate and/or the gaseous precursor is heated. Preferably, the substrate is heated to a temperature in excess of the decomposition temperature of the precursor gases. When the gases are introduced into the reaction chamber and brought into contact with the substrate, the gases decompose on the surface of the substrate to deposit the titanium boronitride film comprising the metal and elements of the precursor or reactant gases.

In an exemplary TCVD process to deposit a boron-doped TiN layer according to the invention using hot or cold wall thermal chemical vapor deposition, the wafer fragment 10 is positioned in the TCVD reactor (not shown) and a gaseous material comprising titanium tetrachloride ($TiCl_4$), diborane ($B_2H_6$), ammonia ($NH_3$), and inert carrier gases such as argon, helium and/or nitrogen, is flowed into the reactor under conditions effective to chemical vapor deposit a layer 32 of boron-doped, $TiCl_4$-based titanium boronitride over the titanium silicide ($TiSi_x$) seed layer 30 within the contact opening 24. The gaseous material is deposited to a thickness to completely fill the contact opening, resulting in the structure shown in FIG. 1C. Preferred flow rates of the gases are about 100 to about 500 sccm $TiCl_4$, about 100 to about 1000 sccm $B_2H_6$, and about 100 to about 1000 sccm $NH_3$. The preferred temperature within the reactor (hot wall) or of the susceptor (cold wall) is from about temperature of about 550 to about 700° C., preferably about 560 to about 650° C., with pressure conditions within the reactor being from about 1 Torr to about 15 Torr, preferably about 10 Torr. Typically, to fill a contact opening, about 1000 to about 3000 angstroms of material is typically deposited.

The deposited conductive layer 32 comprises $TiCl_4$-based, boron doped titanium nitride having the general formula $TiB_xN_y$ (titanium boronitride). The amounts of the $B_2H_6$ and the $NH_3$ gases that are flowed into the system are maintained so as to provide a fill having a level of adherence to the insulative sidewalls 26 of the contact opening 24 such that the formed contact 34 remains attached to and does not peel away from the sidewalls, and no substantial cracks develop in the body of the insulative layer 18.

$TiCl_4$-based TiN contacts that are made without the inclusion of $B_2H_6$ in the gas mixture possess a reduced level of adherence to the insulative sidewalls of a contact opening. This results in the contact peeling away from the sidewalls of the opening. In addition, when such contacts reach a thickness of about 200 angstroms or more, the high thermal stress of the fill material can cause cracking of the insulative layer. With the addition of increasing amounts of $B_2H_6$ to the $TiCl_4$ and $NH_3$ gaseous components, there is an increase in the adhesion of the fill material of the contact 34 with the insulative sidewalls 26 of the opening 24, and a reduction in the thermal stress level, which substantially eliminates cracking of the insulative layer 18. However, as the amount of boron increases, there is also a reduction in the level of conductivity (and increase in resistance) of the contact 34. To counteract this effect, the ammonia in the gas mixture is provided in an amount effective to maintain the conductivity of the formed contact 34 at a predetermined level for an effective electrical contact with the diffusion area 22a or other semiconductor structure.

Referring to FIG. 1D, excess of the conductive layer 32 can then be removed according to known methods in the art, for example, by chemical mechanical polishing (CMP), to form the conductive contact or plug 34 for providing electrical connection to/from the diffusion region (conductive area) 22a to various parts of the semiconductor device.

The resulting contact 34 comprises a boron-doped titanium nitride layer overlying a thin titanium silicide layer deposited onto the substrate at the bottom of the contact opening. The contact 34 possesses a high level of adhesion to the insulative sidewalls of the opening, has a sufficiently low thermal stress level, measured in force per unit area (i.e., $Gdynes/cm^2$), to substantially eliminate cracking of the insulative layer, and is highly conductive with low electrical resistivity.

Although not shown, a passivation layer can then be formed over the device. Optionally, other interconnects and contact structures (not shown) can be formed overlying the present structure.

In another embodiment of the method of the invention, a multi-layered titanium nitride conductive contact can be fabricated in a wafer fragment, as depicted in FIGS. 2A through 2F.

Figure 2A:
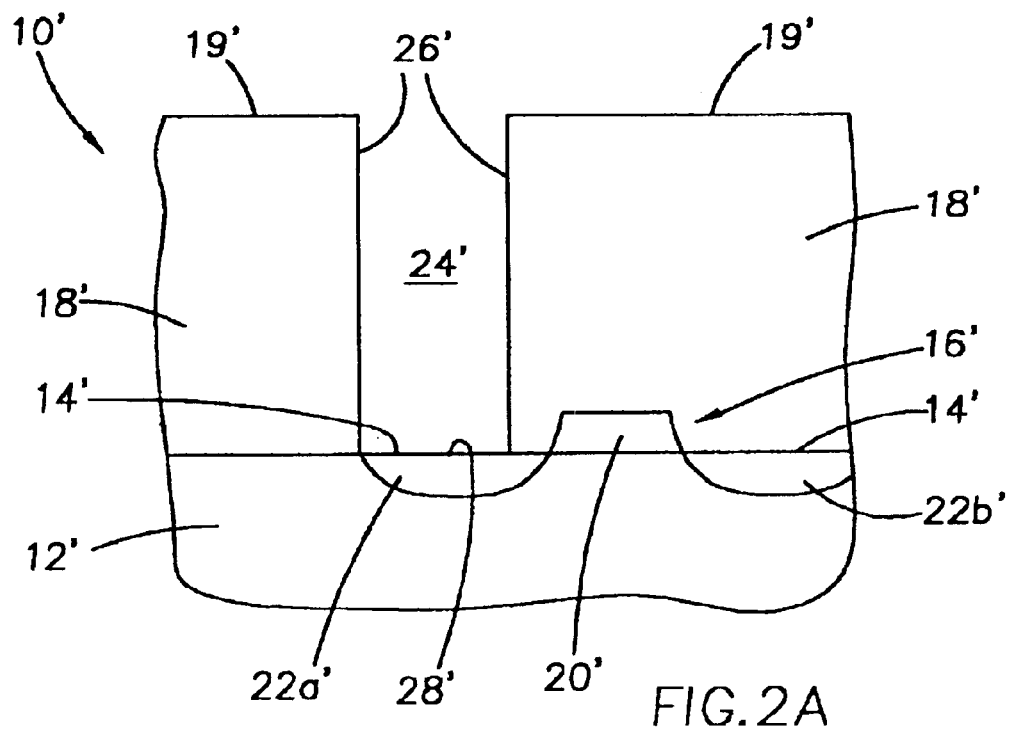
FIGS. 2A through 2F are views of the wafer fragment of FIG. 1A at subsequent and sequential processing steps, showing fabrication of a conductive contact according to another embodiment of the method of the invention.

Referring to FIG. 2A, a wafer fragment 10' is shown before processing. Briefly, wafer fragment 10' includes a silicon-comprising substrate 12', for example, monocrystalline silicon, with a conductive area 22a' such as a source/drain region. An overlying insulative layer 18' comprising, for example, BPSG, has an exposed surface 19' and a contact opening 24' having sidewalls 26' and a bottom portion 28'. The contact opening 24' extends to the conductive area 22a'.

Figure 2B:
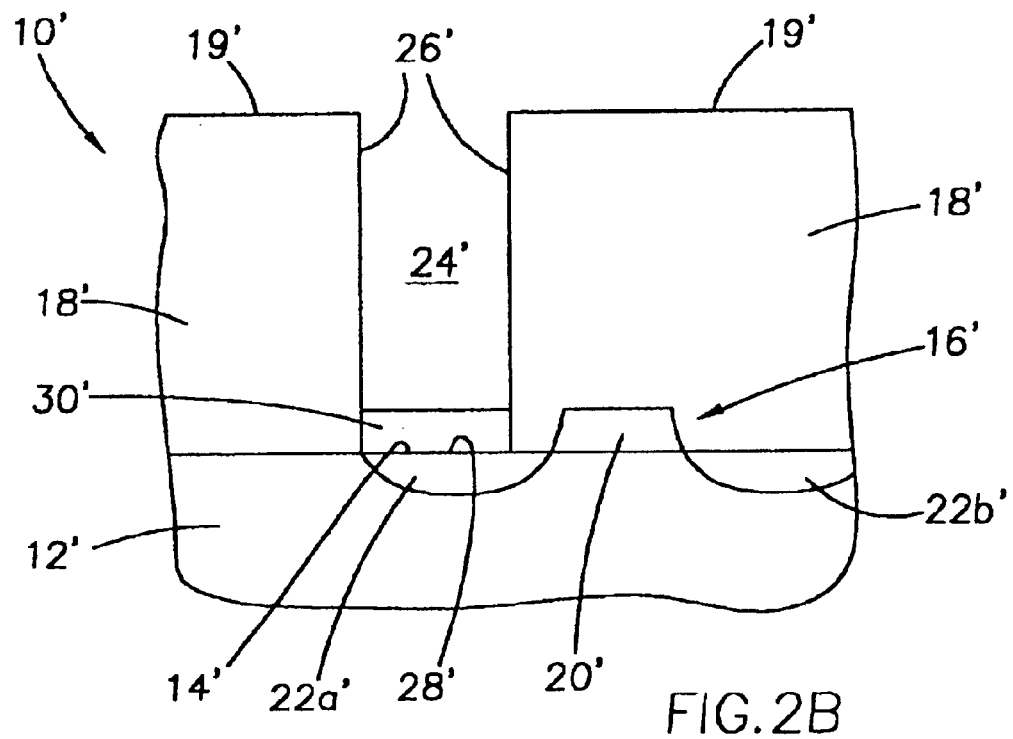

Referring to FIG. 2B, a thin titanium silicide ($TiSi_x$) layer 30' is formed over the conductive area 22a' at the bottom 28' of the opening 24'. The $TiSi_x$ layer 30' preferably has a thickness of about 250 to about 300 angstroms. The $TiSi_x$ layer 30' can be formed by conventional methods, as previously described, and preferably by PECVD using $TiCl_4$, $H_2$, and one or more carrier gases.

A layered conductive contact is formed by depositing alternating layers of $TiCl_4$-based titanium nitride and a boron-doped $TiCl_4$-based titanium nitride into the contact opening, such that a boron-doped titanium nitride layer is interposed between two layers of non-doped titanium nitride. The multi-layered contact can be formed by conventional thermal CVD processing at a temperature of about 550 to about 700° C., preferably about 560 to about 650° C., and a pressure of about 1 Torr to about 15 Torr, preferably about 10 Torr.

Figure 2C:
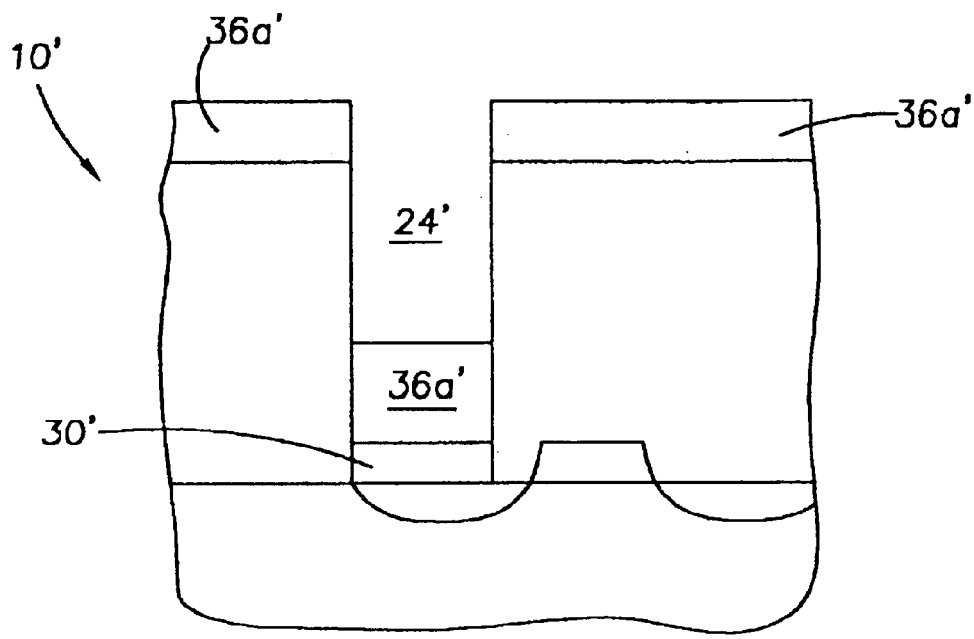

A gas mixture comprising titanium tetrachloride ($TiCl_4$) and ammonia ($NH_3$) and one or more carrier gases can be flowed into the reactor to form a layer 36a' of non-doped titanium nitride onto the $TiSi_x$ seed layer 30' to a desired thickness, typically about 100 to about 500 angstroms, resulting in the structure shown in FIG. 2C. Preferred flow rates for the gas mixture are about 100 to about 500 sccm $TiCl_4$ and about 100 to about 1000 sccm $NH_3$.

Figure 2D:
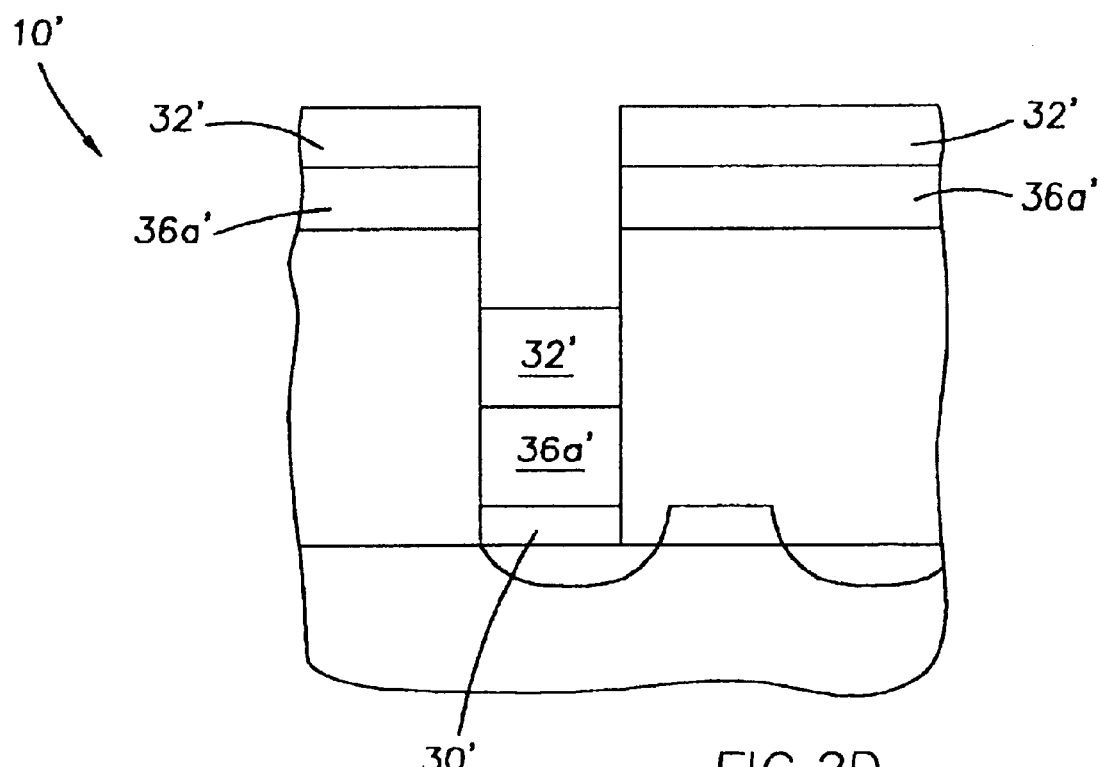

As shown in FIG. 2D, diborane ($B_2H_6$) is then flowed into the reactor, and a layer 32' comprising boron-doped, titanium nitride is deposited onto the non-doped titanium nitride layer from a gas mixture comprising $TiCl_4$, $NH_3$, and $B_2H_6$. The boron-doped, titanium nitride layer 32' is deposited to a desired thickness of about 100 to about 500 angstroms. Preferred flow rates for the gas mixture are about 100 to about 500 sccm $TiCl_4$, about 100 to about 1000 sccm $NH_3$, and about 100 to about 1000 sccm $B_2H_6$. As previously discussed, the flow of $NH_3$ and $B_2H_6$ can be controlled to modify the adhesiveness, thermal stress level, and conductivity of the resulting multi-layered contact.

Figure 2E:
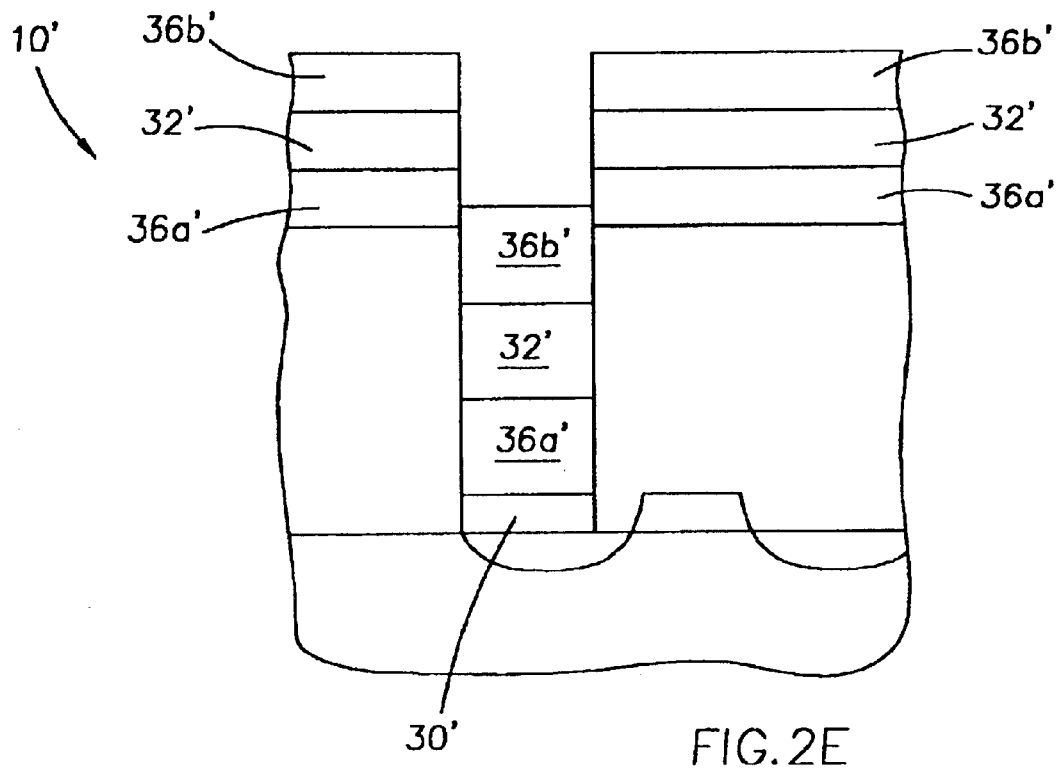

The flow of $B_2H_6$ is then ceased, and the first gas mixture (i.e., $TiCl_4$, $NH_3$) is flowed into the reactor to form a layer 36b' comprising undoped titanium nitride, as shown in FIG. 2E. The titanium nitride layer 36b' is deposited to a desired thickness, typically about 100 to about 500 angstroms. The titanium nitride layer 36b' can be deposited to fill the opening. Alternatively, additional layers of boron-doped titanium nitride can be deposited between two layers of non-doped titanium nitride as desired to fill the contact opening 24', with the uppermost layer of the contact comprising non-doped titanium nitride.

Figure 2F:
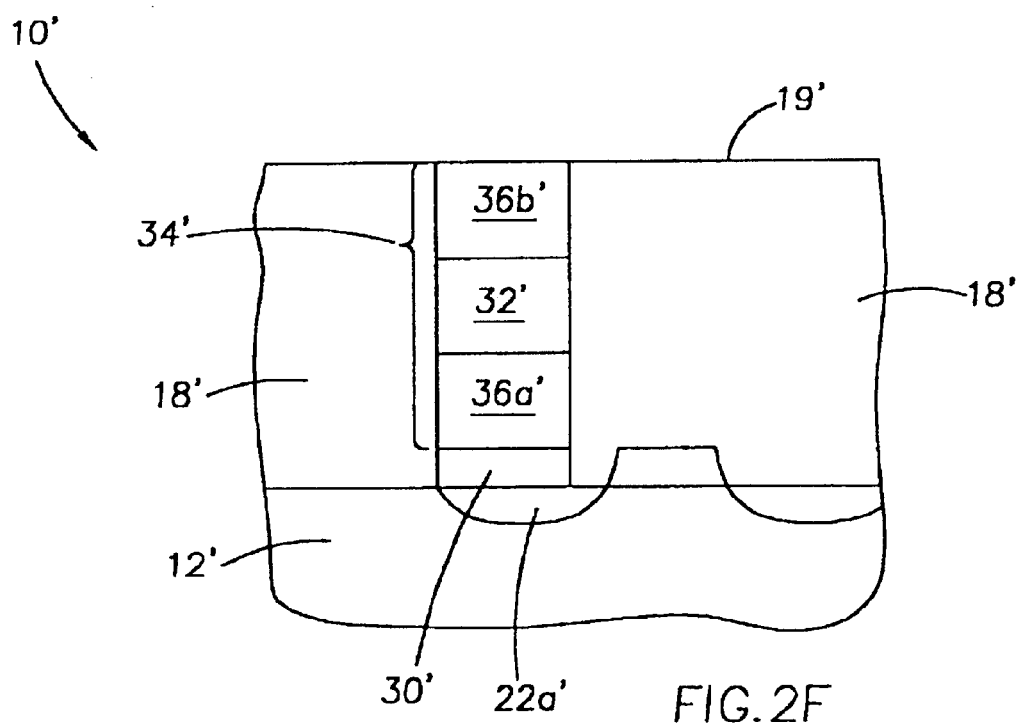

Excess material can be removed as depicted in FIG. 2F, for example, by CMP, to form the conductive contact 34'.

Sandwiching a layer of boron-doped titanium nitride 32' between undoped titanium nitride substantially reduces the thermal stress in a $TiCl_4$-based TiN fill material. This allows the fill to be used as a conductive contact to replace tungsten (W) plugs in high aspect ratio features. The combination of alternating layers achieves a $TiCl_4$-based TiN contact having a level of adhesion that substantially eliminates peeling of the formed contact from the sidewalls of the contact opening. It also provides a lowered level of thermal stress that substantially reduces cracking of the body of the insulative layer, particularly when the thickness of the contact reaches about 500 angstroms or greater. In addition, the resulting contact has a high level of conductivity for an effective electrical contact to a diffusion region or other conductive structure.

EXAMPLE

A boron-doped TiCl$_4$-based titanium nitride (TiN) contact was formed in a high aspect ratio opening of a BPSG layer according to the method of the invention. The flow of diborane (B$_2$H$_6$) was varied over a range to test the change in thermal stress (Gdynes/cm$^2$) of the boron-doped, TiCl$_4$-based TiN contact on the BPSG insulative layer.

A wafer fragment was provided that had a silicon substrate layer and an overlying layer of BPSG. A contact opening was formed through the BPSG layer. The aspect ratio of the opening was 10:1.

The TiCl$_4$-based TiN film was deposited by thermal CVD at a pressure of 10 Torr using a Centura system, available from Applied Materials company of Santa Clara, Calif. The precursor gases were flowed into the reactor as follows: 340 sccm TiCl$_4$, 200 sccm NH$_3$, 3000 sccm argon (Ar), and 2000 sccm gaseous nitrogen (N$_2$) The diborane (B$_2$H$_6$) was flowed into the reactor at a rate ranging from 200 sccm to 600 sccm. Data was measured at two different temperatures: 600° C. and 650° C.

Figure 3A:
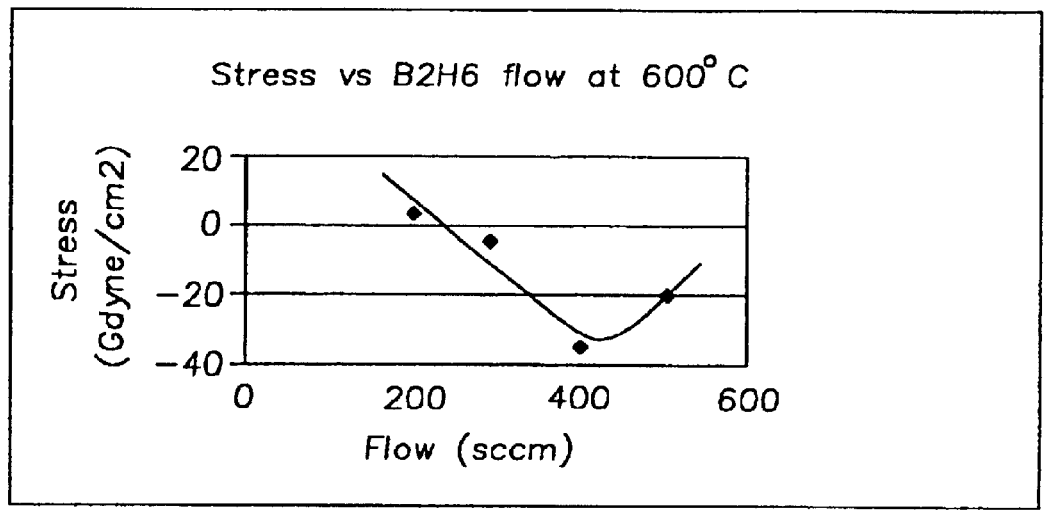
FIGS. 3A and 3B are graphical depictions showing the amount of thermal stress (Gdynes/cm$^2$) versus diborane ($B_2H_6$) flow over a range of 200 to 600 sccm at reactor temperatures of 600° C. and 650° C.
Figure 3B:
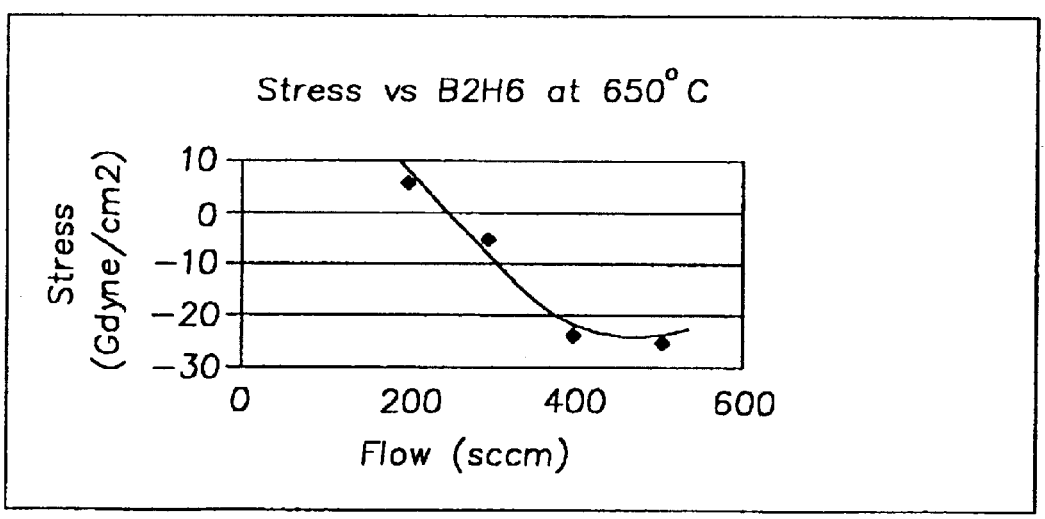

The results are shown in a graphical form in FIGS. 3A and 3B. As indicated, as the amount of boron (i.e., B$_2$H$_6$) was increased, the stress (Gdynes/cm$^2$) of the TiCl$_4$-based TiN material decreased to a neutral or zero stress level and below. Thus, by varying the B$_2$H$_6$ flow, the thermal stress of the TiCl$_4$-based TiN film can be adjusted such that the material does not cause the insulative layer (e.g., BPSG) to crack.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A conductive contact comprising titanium boronitride, and disposed within a contact opening extending through an insulative layer to an underlying silicon-comprising substrate of a semiconductor device; and
    the contact opening defined by sidewalls; and a layer comprising titanium silicide disposed on the silicon-comprising substrate within the opening.

2. The conductive contact of claim 1, comprising an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain conductivity of the contact at a predetermined level for an effective electrical contact with a conductive area.

3. The conductive contact of claim 2, wherein the contact opening has an aspect ratio of 3:1 or greater.

4. The conductive contact of claim 2, wherein the contact opening has a width of about 0.25 μm or less.

5. The conductive contact of claim 2, wherein the conductive contact is selected from the group consisting of a local interconnect, contact, buried contact, via, plug, and filled trench.

6. The conductive contact of claim 2, wherein the conductive contact has a thickness of about 200 angstroms or greater.

7. The conductive contact of claim 2, wherein the conductive contact has a thickness of about 1000 to about 3000 angstroms.

8. The conductive contact of claim 2, wherein the titanium silicide layer has a thickness of about 250 to about 300 angstroms.

9. The conductive contact of claim 2, comprising the titanium boronitride layer is interposed between layers comprising titanium nitride.

10. The conductive contact of claim 2, comprising multiple overlying layers of titanium boronitride and titanium nitride, wherein the titanium boronitride layer is interposed between titanium nitride layers.

11. The conductive contact of claim 10, wherein each of the layers of the conductive contact are about 100 to about 500 angstroms thick.

12. The conductive contact of claim 2, wherein the insulative layer comprises an oxide selected from the group consisting of silicon dioxide, phosphosilicate glass, borosilicate glass, and borophosphosilicate glass.

13. The conductive contact of claim 2, wherein the insulative layer comprises borophosphosilicate glass.

14. A conductive contact of a semiconductor device, the conductive contact disposed within an opening having sidewalls and extending through an insulative layer to an underlying silicon-comprising substrate, the conductive contact comprising titanium boronitride overlying a layer of titanium silicide disposed on the silicon-comprising substrate, and an amount of boron effective to provide the conductive contact with a level of adhesion to the insulative layer within the opening to substantially eliminate peeling of the conductive contact from the sidewalls of the opening and a level of thermal stress to substantially eliminate cracking of the insulative layer; and an amount of nitrogen effective to maintain conductivity of the contact at a predetermined level for an effective electrical contact with a conductive area.

15. The conductive contact of claim 14, wherein the contact opening has an aspect ratio of 3:1 or greater.

16. The conductive contact of claim 14, wherein the contact opening has a width of about 0.25 μm or less.

17. The conductive contact of claim 14, wherein the conductive contact has a thickness of about 200 angstroms or greater.

18. The conductive contact of claim 14, comprising the titanium boronitride layer interposed between titanium nitride layers.

19. The conductive contact of claim 14, comprising multiple overlying layers of titanium boronitride and titanium nitride, the titanium boronitride layer interposed between titanium nitride layers.

20. A conductive contact of a semiconductor device, the conductive contact disposed within an opening having sidewalls and extending through an insulative layer to an underlying silicon-comprising substrate, the conductive contact comprising titanium boronitride overlying a layer of titanium silicide disposed on the silicon-comprising substrate, the conductive contact having a thickness of at least about 200 angstroms, and adhered to the sidewalls of the opening with substantially no peeling from the sidewalls and no cracking of the insulative layer.

21. A conductive contact of a semiconductor device, the conductive contact disposed within an opening having sidewalls and extending through an insulative layer to an underlying silicon-comprising substrate, a layer of titanium silicide disposed over the silicon-comprising substrate; the conductive contact comprising a titanium boronitride layer interposed between titanium nitride layers.

22. The conductive contact of claim 21, comprising an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain the conductivity of the contact at a predetermined level for an effective electrical contact with a conductive area.

23. The conductive contact of claim 21, wherein the contact opening has an aspect ratio of 3:1 or greater.

24. The conductive contact of claim 21, wherein the contact opening has a width of about 0.25 µm or less.

25. The conductive contact of claim 21, wherein the conductive contact is selected from the group consisting of a local interconnect, contact, buried contact, via, plug, and filled trench.

26. The conductive contact of claim 21, wherein the conductive contact has a thickness of about 200 angstroms or greater.

27. The conductive contact of claim 21, wherein the conductive contact has a thickness of about 1000 to about 3000 angstroms.

28. The conductive contact of claim 21, wherein the titanium silicide layer has a thickness of about 250 to about 300 angstroms.

29. The conductive contact of claim 21, comprising multiple overlying layers of titanium boronitride and titanium nitride, the titanium boronitride layer interposed between titanium nitride layers.

30. The conductive contact of claim 21, wherein each of the layers of the conductive contact are about 100 to about 500 angstroms thick.

31. A conductive contact of a semiconductor device, the conductive contact x disposed within an opening having sidewalls and extending through an insulative layer to an underlying silicon-comprising substrate, a layer of titanium silicide disposed on the silicon-comprising substrate; the conductive contact comprising a titanium boronitride layer interposed between titanium nitride layers, and having a thickness of at least about 200 angstroms; the conductive contact having a level of adhesion to the insulative layer to substantially eliminate peeling of the contact from the sidewalls of the opening and cracking of the insulative layer.

32. A semiconductor circuit, comprising:
a conductive contact comprising titanium boronitride and disposed within a contact opening extending through an insulative layer to an underlying silicon-comprising substrate of a semiconductor device; titanium silicide layer disposed on the silicon-comprising substrate within the opening; the contact opening defined by sidewalls.

33. The semiconductor circuit of claim 32, wherein the conductive contact comprises an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain conductivity of the contact at a predetermined level for an effective electrical contact with a conductive area within the substrate.

34. The semiconductor circuit of claim 32, wherein the contact opening has an aspect ratio of 3:1 or greater.

35. The semiconductor circuit of claim 32, wherein the contact opening has a width of about 0.25 µm or less.

36. The semiconductor circuit of claim 32, wherein the conductive contact has a thickness of about 200 angstroms or greater.

37. The semiconductor circuit of claim 32, wherein the conductive contact has a thickness of about 1000 to about 3000 angstroms.

38. The semiconductor circuit of claim 32, wherein the conductive contact comprises the titanium boronitride layer interposed between titanium nitride layers.

39. The semiconductor circuit of claim 32, wherein the conductive contact comprises multiple overlying layers of titanium boronitride and titanium nitride, the titanium boronitride layer interposed between titanium nitride layers.

40. The semiconductor circuit of claim 39, wherein each of the layers of the conductive contact are about 100 to about 500 angstroms thick.

41. A semiconductor circuit, comprising:
a conductive contact comprising titanium boronitride and disposed within a contact opening extending through an insulative layer to an underlying silicon-comprising substrate of a semiconductor device, a layer comprising titanium silicide overlying the silicon-comprising substrate within the opening; the contact opening defined by sidewalls; and
the conductive contact comprising an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain conductivity of the contact at a predetermined level for an effective electrical contact with a conductive area within the substrate.

42. The semiconductor circuit of claim 41, wherein the contact opening has an aspect ratio of 3:1 or greater.

43. The semiconductor circuit of claim 41, wherein the contact opening has a width of about 0.25 µm or less.

44. The semiconductor circuit of claim 41, wherein the conductive contact has a thickness of about 200 angstroms or greater.

45. A semiconductor circuit, comprising:
a conductive contact comprising a titanium boronitride layer interposed between titanium nitride layers, and disposed within a contact opening extending through an insulative layer to an underlying silicon-comprising substrate of a semiconductor device, a titanium silicide layer overlying the silicon-comprising substrate within the opening; the contact opening defined by sidewalls.

46. The semiconductor circuit of claim 45, wherein the conductive contact comprises an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain conductivity of the contact at a predetermined level for an effective electrical contact with a conductive area.

47. The semiconductor circuit of claim 45, wherein the contact opening has an aspect ratio of 3:1 or greater.

48. The semiconductor circuit of claim 45, wherein the contact opening has a width of about 0.25 µm or less.

49. The semiconductor circuit of claim 45, wherein the conductive contact is selected from the group consisting of a local interconnect, contact, buried contact, via, plug, and filled trench.

50. The semiconductor circuit of claim 45, wherein the conductive contact has a thickness of about 200 angstroms or greater.

51. A semiconductor circuit, comprising:
- a conductive contact comprising a layer comprising titanium boronitride interposed between titanium nitride layers, and disposed within a contact opening extending through an insulative layer to an underlying silicon-comprising substrate of a semiconductor device, a titanium silicide layer overlying the silicon-comprising substrate within the opening; the contact opening defined by sidewalls;
- wherein the conductive contact comprises an amount of boron effective to provide the conductive contact with a level of adhesion to the insulative layer within the opening to substantially eliminate peeling of the conductive contact from the sidewalls of the opening, and a level of thermal stress to substantially eliminate cracking of the insulative layer; and an amount of nitrogen effective to maintain conductivity of the contact at a predetermined level for an effective electrical contact with a conductive area.

52. The semiconductor circuit of claim 51, wherein the contact opening has an aspect ratio of 3:1 or greater.

53. The semiconductor circuit of claim 51, wherein the contact opening has a width of about 0.25 µm or less.

54. The semiconductor circuit of claim 51, wherein the conductive contact has a thickness of about 200 angstroms or greater.

55. An integrated circuit memory device, comprising:
- an array of memory cells;
- internal circuitry; and
- at least one generally vertical conductive contact coupled to the memory array and internal circuitry, the conductive contact comprising titanium boronitride disposed within a contact opening over a titanium silicide layer overlying a silicon-comprising conductive area of a memory array.

56. The memory device of claim 55, whereby the opening is defined by sidewalls, and the conductive contact comprises an amount of boron effective to provide a level of adhesion of the conductive contact to the insulative layer to substantially eliminate peeling of the conductive contact from the sidewalls of the opening and cracking of the insulative layer, and an amount of nitrogen effective to maintain conductivity of the contact at a predetermined level for an effective electrical contact with the conductive area of the memory array.

57. The memory device of claim 56, wherein the conductive area comprises a source/drain of a transistor.

58. An integrated circuit memory device, comprising:
- an array of memory cells;
- internal circuitry; and
- at least one generally vertical conductive contact coupled to the memory array and internal circuitry, the conductive contact comprising alternating layers of titanium nitride and titanium boronitride disposed within a contact opening over a titanium silicide layer overlying a silicon-comprising conductive area of a memory array, the titanium boronitride layer disposed between titanium nitride layers.

59. The memory device of claim 58, whereby the opening is defined by sidewalls, and the conductive contact comprises an amount of boron effective to provide a level of adhesion of the conductive contact to the insulative layer to substantially eliminate peeling of the conductive contact from the sidewalls of the opening and cracking of the insulative layer, and an amount of nitrogen effective to maintain conductivity of the contact at a predetermined level for an effective electrical contact with the conductive area of the memory array.

60. The memory device of claim 59, wherein the conductive area comprises a source/drain of a transistor.

61. A conductive contact comprising a layer of titanium boronitride disposed in a substrate.

62. The contact of claim 61, wherein the conductive contact has effective levels of conductivity and resistivity, and a level of adhesion to the substrate to substantially eliminate peeling of the contact therefrom.

63. The contact of claim 61, wherein the titanium boronitride layer is disposed between titanium nitride layers.

64. The contact of claim 61, wherein the conductive contact is disposed in an opening in the substrate having an aspect ratio of 3:1 or greater and a width of about 0.25 µm or less.

65. The contact of claim 61, wherein the conductive contact has a thickness of about 1000 to about 3000 angstroms.

66. The contact of claim 61, wherein the conductive contact is selected from the group consisting of a local interconnect, contact, buried contact, via, plug, and filled trench.

67. A conductive contact disposed in a substrate, the contact comprising a layer of titanium boronitride disposed between titanium nitride layers.

68. An integrated circuit device, comprising:
- at least one conductive contact disposed in a substrate and electrically connected to an active area in the substrate, the at least one conductive contact comprising titanium boronitride.

69. The device of claim 68, wherein the conductive contact has effective levels of conductivity and resistivity, and a level of adhesion to the substrate to substantially eliminate peeling of the contact therefrom.

70. The device of claim 68, wherein the conductive contact comprises the titanium boronitride layer disposed between titanium nitride layers.

71. The device of claim 68, wherein the conductive contact is disposed in an opening in the substrate having an aspect ratio of 3:1 or greater and a width of about 0.25 µm or less.

72. The device of claim 68, wherein the conductive contact has a thickness of about 1000 to about 3000 angstroms.

73. The device of claim 68, wherein the conductive contact is disposed over a layer of titanium silicide having a thickness of about 250 to about 300 angstroms.

74. The device of claim 68, wherein the conductive contact is selected from the group consisting of a local interconnect, contact, buried contact, via, plug, and filled trench.

75. The device of claim 68, wherein the active area comprises a source/drain region.

76. An integrated circuit device, comprising:
- at least one conductive contact disposed in a substrate and electrically connected to a conductive area in the substrate, the at least one conductive contact comprising titanium boronitride.

77. The device of claim 76, wherein the conductive contact is electrically connected to a transistor.

78. The device of claim 76, wherein the conductive contact is electrically connected to a conductive area of a memory cell.

79. An integrated circuit device, comprising:
- at least one conductive contact disposed in a substrate and electrically connected to an active area in the substrate, the at least one conductive contact comprising a titanium boronitride layer disposed between titanium nitride layers.

80. The device of claim 79, wherein the conductive contact is disposed in an opening in the substrate having an aspect ratio of 3:1 or greater and a width of about 0.25 $\mu$m or less.

81. The device of claim 79, wherein the conductive contact has a thickness of about 1000 to about 3000 angstroms.

82. The device of claim 79, wherein the conductive contact is selected from the group consisting of a local interconnect, contact, buried contact, via, plug, and filled trench.

83. The device of claim 79, wherein the conductive contact is electrically connected to a semiconductor device selected from the group consisting of a capacitor, resistor, transistor, and diode.

84. An integrated circuit device, comprising:
at least one conductive contact disposed in a substrate and electrically connected to an active area in the substrate, the at least one conductive contact comprising alternating layers of titanium nitride and titanium boronitride.

85. An integrated circuit device, comprising:
at least one conductive contact disposed in a substrate and electrically connected to an active area in the substrate, the at least one conductive contact comprising alternating layers of titanium nitride and titanium boronitride disposed within an opening over a titanium silicide layer disposed over the substrate, the titanium boronitride layer disposed between titanium nitride layers.

86. An integrated circuit device, comprising:
at least one conductive contact disposed in a substrate and electrically connected to a conductive area in the substrate, the at least one conductive contact comprising alternating layers of titanium nitride and titanium boronitride disposed within an opening over a titanium silicide layer disposed over the substrate, the titanium boronitride layer disposed between titanium nitride layers.

87. An integrated circuit memory device, comprising:
an array of memory cells;
internal circuitry; and
at least one conductive contact coupled to the memory array and the internal circuitry, the conductive contact comprising titanium boronitride.

88. An integrated circuit memory device, comprising:
an array of memory cells;
internal circuitry; and
at least one conductive contact coupled to the memory array and the internal circuitry, the conductive contact comprising a layer of titanium boronitride disposed between titanium nitride layers.

89. A conductive contact comprising overlying layers of titanium boronitride and titanium nitride disposed within an opening in an insulative layer.

90. A conductive contact disposed within an opening in an insulative layer overlying a substrate, the conductive contact formed by a process comprising the steps of:
forming a layer of titanium silicide on the substrate within the opening; and
depositing a gaseous mixture comprising titanium tetrachloride, ammonia and diborane over the titanium silicide layer within the opening to form the conductive contact.

91. A conductive contact disposed within an opening in an insulative layer overlying a substrate, the conductive contact formed by a process comprising the steps of:
forming a layer of titanium silicide on the substrate within the opening; and
depositing a gaseous mixture comprising titanium tetrachloride, ammonia and diborane by thermal chemical vapor deposition into the opening to form the conductive contact.

92. A conductive contact disposed within an opening in an insulative layer overlying a substrate, the conductive contact formed by a process comprising the steps of:
forming a layer of titanium silicide on the substrate within the opening; and
depositing a gaseous mixture comprising titanium tetrachloride, ammonia and diborane within the opening to form the conductive contact;
the gaseous mixture comprising an amount of the diborane to provide the contact with an amount of boron for effective adhesion of the contact to the insulative sidewalls of the opening to substantially eliminate peeling of the contact from the sidewalls and cracking of the insulative layer, and an amount of the ammonia to provide the contact with a level of nitrogen for an effective level of conductivity to an active area within the substrate.

93. A conductive contact disposed within an opening in an insulative layer overlying a substrate, the conductive contact formed by a process comprising the steps of:
forming a layer of titanium silicide on the substrate within the opening; and
depositing a gaseous mixture comprising titanium tetrachloride, ammonia and diborane within the opening to form the conductive contact;
wherein the contact comprises an amount of boron for effective adhesion to the insulative layer within the opening to substantially eliminate peeling of the contact from and cracking of the insulative layer, and an amount nitrogen for an effective level of conductivity through the contact to an active area within the substrate.

94. A conductive contact disposed within an opening in an insulative layer overlying a substrate the conductive contact formed by a process comprising the steps of:
forming a layer of titanium silicide on the substrate within the opening;
depositing a gaseous mixture comprising titanium tetrachloride and ammonia within the opening to form a layer of titanium nitride over the titanium silicide layer;
depositing a gaseous mixture comprising titanium tetrachloride, ammonia and diborane within the opening to form a layer of titanium boronitride over the titanium nitride layer; and
depositing a gaseous mixture comprising titanium tetrachloride and ammonia within the opening to form a layer of titanium nitride over the titanium boronitride layer.

95. A conductive contact disposed within an opening in an insulative layer overlying a substrate, the conductive contact formed by a process comprising the steps of:
forming a layer of titanium silicide on the substrate within the opening;

depositing a gaseous mixture comprising titanium tetrachloride and ammonia within the opening to form a layer of titanium nitride over the titanium silicide layer;

depositing a gaseous mixture comprising titanium tetrachloride ammonia and diborane within the opening to form a layer of titanium boronitride over the titanium nitride layer;

depositing a gaseous mixture comprising titanium tetrachloride and ammonia within the opening to form a layer of titanium nitride over the titanium boronitride layer; and repeating the steps of depositing the gaseous mixtures to form sequential layers of titanium nitride and titanium boronitride to form the conductive contact, wherein the titanium boronitride layer is disposed between titanium nitride layers.

* * * * *

UNITED STATES PATENT AND TRADEMARK OFFICE
CERTIFICATE OF CORRECTION

PATENT NO. : 6,822,299 B2  Page 1 of 1
DATED : November 22, 2004
INVENTOR(S) : Ammar Derraa, Sujit Sharan and Paul Castrovillo It is certified that error appears in the above-identified patent and that said Letters Patent is hereby corrected as shown below:

Column 11,
Line 33, delete "x".

Signed and Sealed this

Nineteenth Day of July, 2005

JON W. DUDAS
*Director of the United States Patent and Trademark Office*